United States Patent [19]

Goinga

[11] Patent Number: 4,590,547
[45] Date of Patent: May 20, 1986

[54] ACTIVE FULL-WAVE RECTIFIER DETECTOR CIRCUIT

[75] Inventor: Ynze D. Goinga, Borne, Netherlands

[73] Assignee: Hazemeijer B.V., Hengelo, Netherlands

[21] Appl. No.: 654,954

[22] Filed: Sep. 27, 1984

[30] Foreign Application Priority Data

Sep. 28, 1983 [NL] Netherlands .......................... 8303319

[51] Int. Cl.[4] ........................................... H02M 7/217
[52] U.S. Cl. ..................................... 363/127; 324/51; 324/55
[58] Field of Search .................... 307/491; 363/70, 89, 363/127; 323/358; 324/51, 55

[56] References Cited

U.S. PATENT DOCUMENTS

| | | | |
|---|---|---|---|
| 3,667,028 | 5/1972 | Leufgen | 363/127 |
| 3,940,681 | 2/1976 | Ohsawa | 363/127 |
| 3,958,170 | 5/1976 | Hodgson | 363/127 |
| 4,307,305 | 12/1981 | Morris | 363/127 |
| 4,519,024 | 5/1985 | Federico et al. | 363/89 |

OTHER PUBLICATIONS

Electronic Design, vol. 31, No. 2, Jan. 20, 1983, WASECA.

Primary Examiner—William H. Beha, Jr.
Assistant Examiner—Jeffrey Sterrett
Attorney, Agent, or Firm—Watson Cole Grindle & Watson

[57] ABSTRACT

Active full-wave rectifier circuit for a current transformer used for example in an earth leak detector circuit and comprising active components such as operational amplifiers and transistors to detect and process relatively weak output voltages.

4 Claims, 13 Drawing Figures

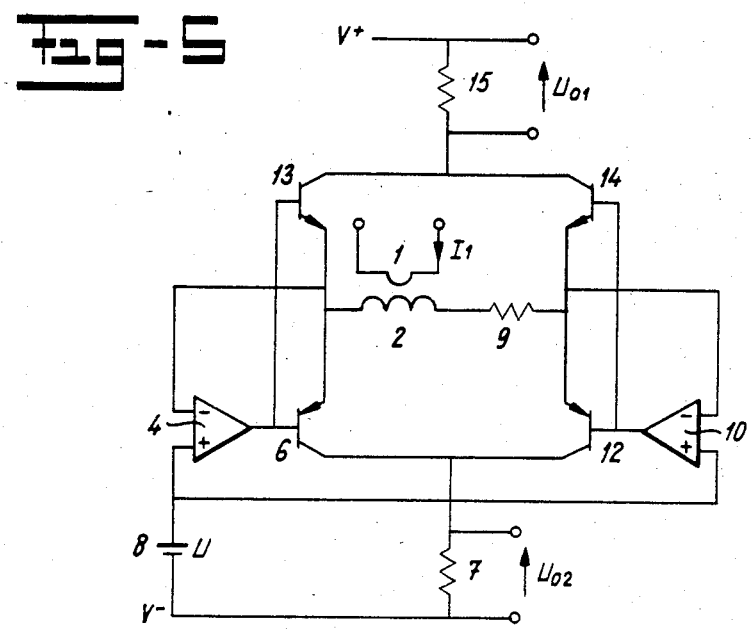

ACTIVE FULL-WAVE RECTIFIER DETECTOR CIRCUIT

BACKGROUND OF THE INVENTION

1. Field of the Invention

The invention relates to an active double-sided rectifier circuit which is particularly suitable for use with a current transformer which is used, for example, in an earth leakage detector. Such detectors must be able to indicate very weak currents and, because they are installed in distributing boxes, must not have large dimensions. However, the invention is obviously not restricted to this use.

2. Description of the Related Art

The most usual circuit for rectifying a current from a current transformer is formed by a diode bridge composed of four diodes and connected to the secondary winding of the current transformer. This rectifier circuit has the advantage of full-wave rectification and consists of few, passive components, while the output is potential free, so that there is free choice in respect of direct current level.

This known circuit nevertheless has disadvantages making it less suitable, for example, for earth leakage detectors. When the diode bridge output is loaded, this loading will adversely affect the transmission of the current transformer. This transmission is ideal only with short-circuited output terminals. The voltage drop across the diodes in the forward direction also influences the transmission. This voltage drop may be of the order of 600 mV in the case of of an Si diode.

FIGS. 1 and 2 show equivalent circuit diagrams of current transformers. In FIG. 2, L is the self-induction of the secondary windings and R the output resistance. For the output voltage $U_o$:

$$U_o = \frac{2\pi f L R}{[(2\pi f L)^2 + R^2]^{\frac{1}{2}}} \cdot \frac{I_1}{n} \tag{1}$$

Transmission becomes maximum at $R = \infty$, when $$U_o = 2\pi f L \cdot \frac{I_1}{n} \tag{2}$$

A small toroidal core transformer having 1000 turns has a self-inductance of about 5H. When the primary current to be measured amounts to 20 mA, and with a mains frequency of 50 Hz the output voltage $U_o$ is:

$$U_o = 2\pi .50.5.20 \ 10^6 = 31 \ mV \tag{3}$$

Because of the abovementioned diode voltage of 600 mV in the forward direction, the low voltage of 31 mV mentioned cannot be rectified with a passive diode bridge of this kind.

This shortcoming can be avoided by making the current transformer heavier, with a secondary winding with high self-inductance. This, however, leads to an undesired larger volume and to a higher price.

These disadvantages can be obviated by using a rectifier circuit having active components, such as operational amplifiers and transistors. The price and the volume of these components justify their use, and in addition they can be made in the form of an integrated unit, while use may be made of a small and inexpensive current transformer.

FIG. 3 shows an example of a possible circuit with active components and half-wave rectification.

The current transformer with a transmission ratio of 1:n is provided with a primary winding 1 and a secondary winding 2. A connection terminal of the secondary winding is connected via a capacitor 3 or a resistor 9, shown above it, to an input terminal of the operational amplifier 4, while the other connection terminal of the secondary winding 2 is connected to the other input terminal of the operational amplifier 4. The output of the operational amplifier 4 is connected to the base of the transistor 6 and likewise to the anode of the diode 5. The emitter of the transistor 6 and the cathode of the diode 5 are connected to the negative input of the operational amplifier. Because the input impedance of the feedback amplifier is very low, the current transformation will be ideal, namely $I_2 = 1/n \ I_1$.

The output voltage $U_o$ occurs through the output resistor 7. The transistor circuit is supplied by a current source 8. In this half-wave rectifier circuit, the following applies to the positive half-cycle of a sinusoidal alternating current:

$$U_o = I_2 \cdot \alpha \cdot R_L. \tag{5}$$

$I_2$ is here the current through the secondary winding, $\alpha$ is about 0.99, that is to say the ratio between the collector current and the emitter current of the transistor 6, while $R_L$ represents the value of the output resistor 7.

During the negative half-cycle the output voltage $U_o$ is equal to 0. The following therefore applies to the mean value $\overline{U}_o$ when n is for example selected at 1000:

$$\overline{U}_o = \frac{1}{2} \ \overline{I}_2 R_L = \frac{1}{2000} \cdot \overline{I}_1 \cdot R_L \tag{5}$$

Here $\overline{U}_o$ and $\overline{I}_o$ represent the mean values.

However, this circuit once again has some disadvantages. In order to prevent the input offset of the operational amplifier from causing heavy currents to flow through the secondary winding and, through the action of the operational amplifier, also through the diode and the transistor, this voltage link to the secondary winding for direct current would have to be interrupted; in FIG. 3 this is done with the aid of the capacitor 3. In order however to allow sufficient current to pass with a mains frequency of 50 Hz, the capacitance of this capacitor 3 would have to be fairly high, at least 5 μF, which is possible only with two electrolytic capacitors connected oppositely in series. This, however, is an expensive solution.

This expensive solution can be avoided by using, instead of a capacitor 3, the resistor 9, shown above the capacitor 3, in the input connection to the secondary winding. This input resistor 9 must then have a sufficiently high ohmic value so that the current produced by the offset will in all cases be kept sufficiently low.

If for this input resistor 9 a value of 1 k Ω is selected and if a value of 1 M Ω is selected for the output resistor 7, then for an offset of 2 mV an output voltage through the resistor 7 of 2 V is obtained, namely:

$$U_o = \frac{R_L}{R_S} \cdot 2 \cdot 10^{-3} = 2 \frac{10^6}{10^3} \cdot 10^{-3} = 2 \ V. \tag{6}$$

This 2 V output offset will be too high for almost all applications and thus cannot be accepted.

The use of only one half-cycle because of the single-sided rectification also leads to additional time delay and to ripple.

SUMMARY OF THE INVENTION

The above disadvantages can now be avoided by the active full-wave rectifier circuit of the invention, which is characterised by two transistors of the same conduction type, each of which is connected by its emitter or collector to a respective output terminal of the secondary winding of the transformer, their collectors and emitters being respectively joined together and connected to an output resistor; two operational amplifiers, each with a first input of the one polarity connected to a respective output terminal of the secondary winding, with the output connected to the base of the transistor connected to the same secondary winding, while their second inputs of the other polarity are joined together and by means of a voltage source kept at a potential which is higher than the product of the maximum current to be expected through the output resistor and the resistance value of the output resistor; two devices allowing current to pass in one direction, one of them being connected in each case between the output and the first input of the operational amplifier; at least one series resistor connected to at least one of the output terminals of the secondary winding.

The devices allowing the passage of current in one direction may be diodes.

In the circuit according to the invention the fraction of the current $I_2$ which flows in consequence of the offset voltage of two amplifier inputs becomes negligible in relation to the rectified current. The offset fraction in $I_2$ is in fact added to the rectified current during one half-cycle and deducted from the rectified current during the other half-cycle. If for example the offset component in $I_2$ amounts to 20% of the amplitude of the current which is to be rectified, its proportion in the rectified current amounts to only 2%. This point will be further explained below. In addition, both half-cycles are used, so that there is no time delay.

It is a disadvantage of this active rectifier circuit that the current which flows through the output resistor during each half-cycle also flows through one of the transistors and through the diode connected to the other transistor. The current through this diode must however be able to be supplied by the associated operational amplifier, but most operational amplifiers can supply a current of only up to about 10 mA.

This disadvantage is overcome by another embodiment of the invention, which is characterised in that the devices allowing the passage of current in one direction are other transistors of the same but opposite conduction type as the two first-mentioned transistors, the bases of these additional transistors being connected respectively to the outputs of the operational amplifiers, and their emitters or collectors being connected to the respective emitters and collectors of the two first-mentioned transistors, while the collectors and emitters of these two additional transistors are respectively connected to each other and to one pole of a voltage source, the other pole of which is connected to the output resistor on the side remote from the point of connection of this output resistor to the respective interconnected collectors and emitters of the first two transistors.

BRIEF DESCRIPTION OF THE DRAWINGS

The invention will now be further explained with the aid of the drawings, wherein:

FIG. 5 shows a similar circuit in which the diodes are replaced by transistors;

FIGS. 6 and 7 show the current flow during two successive halves of a cycle;

DETAILED DESCRIPTION OF THE PREFERRED EMBODIMENTS

Figure 1:
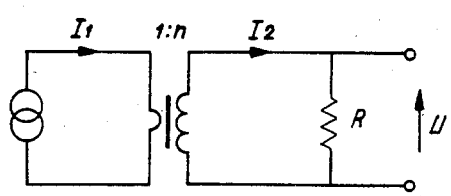
FIGS. 1 and 2 are equivalent circuit diagrams of current transformers.
Figure 2:
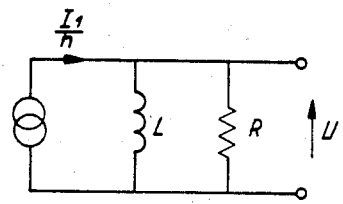
Figure 3:
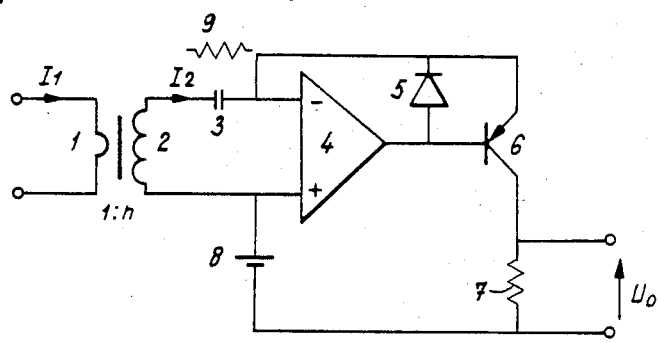
FIG. 3 illustrates a half-wave rectifier detector circuit.

In the Figures, like components are given the same reference numerals.

Figure 4:
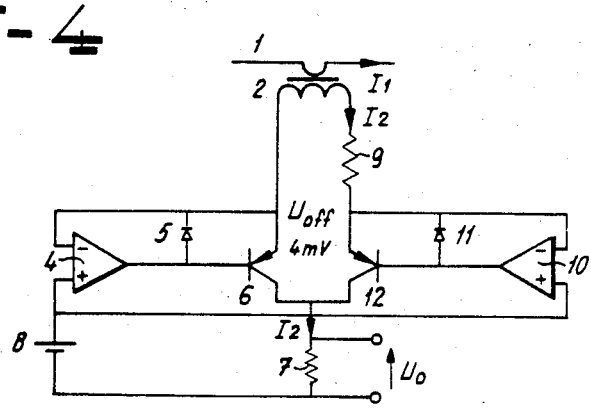
FIG. 4 shows a circuit according to the invention, with diodes in the feedback circuit.

In the active full-wave rectifier detector circuit according to FIG. 4, one of the output terminals of the secondary winding 2 is connected, instead of to the other side of the operational amplifier 4, to one input of corresponding polarity of another operational amplifier 10, and also to the emitter of another transistor 12. The two transistors 6 and 12 are here of the PNP type, but this is not essential for the present invention. Both operational amplifiers 4 and 10 are connected by their inputs of the same polarity to the secondary winding. The supply sources for the operational amplifiers 4 and 10 are omitted from this circuit diagram for the sake of clarity.

As already observed, this circuit has the advanage that in the output current the proportion of current resulting from the offset voltage is negligible for currents to be rectified whose amplitude is a few times greater than this offset current. However, in certain circumstances it may be a disadvantage that the operational amplifiers 4 and 10 must be able to supply the currents through the appertaining diodes 5 and 11 during alternative half-cycles. The current intensity to be processed is in fact limited thereby.

This difficulty can be avoided by replacing the diodes 5 and 11 by transistors, as is the case in the circuit shown in FIG. 5.

In this circuit the transistors 13 and 14 take the place of the diodes 5 and 11 in FIG. 4. The bases and emitters of these transistors 13 and 14 are connected between the output and the input of the respective operational amplifiers 4 and 10, in the same manner as the anode and cathode of the diodes 5 and 11 in FIG. 4.

Because the diodes are replaced by these transistors, considerably greater currents can be rectified. For this purpose another voltage source is used, of which one pole is connected to that end of the output resistor 7 which is remote from the point of connection between the collectors of the transistors 6 and 12, while the other pole of this supply source can be connected to the point of connection between the collectors of the transistors 13 and 14. The output resistor can now however also be disposed between the point of connection of the collectors 13 and 14 and the aforesaid other pole of the current source, as is indicated by the resistor 15.

To sum up, the use of the transistors 13, 14 in place of the diodes 5, 11 provides the principal advantages that the operational amplifiers themselves no longer need to supply the current of one of the half-cycles, and that the rectified current can be converted via a resistor into a voltage, namely to V+, V− or both.

FIGS. 6 and 7 show in heavier lines the path of the current during the negative and positive half-cycles respectively.

In FIG. 6 the current flows from the connection point between the collectors of the transistors 13 and 14 to the collector of the transistor 13, via the emitter of this transistor 13 through the secondary winding 2 of the current transformer, then through the series resistor 9, to the emitter of the transistor 12 and via the collector of the latter to the other pole of the supply source.

During the next half-cycle the current flows to the transistor 14, resistor 9, secondary winding 2, to the emitter of the transistor 6 and via the collector of this transistor to the other pole of the supply source.

Figure 8:
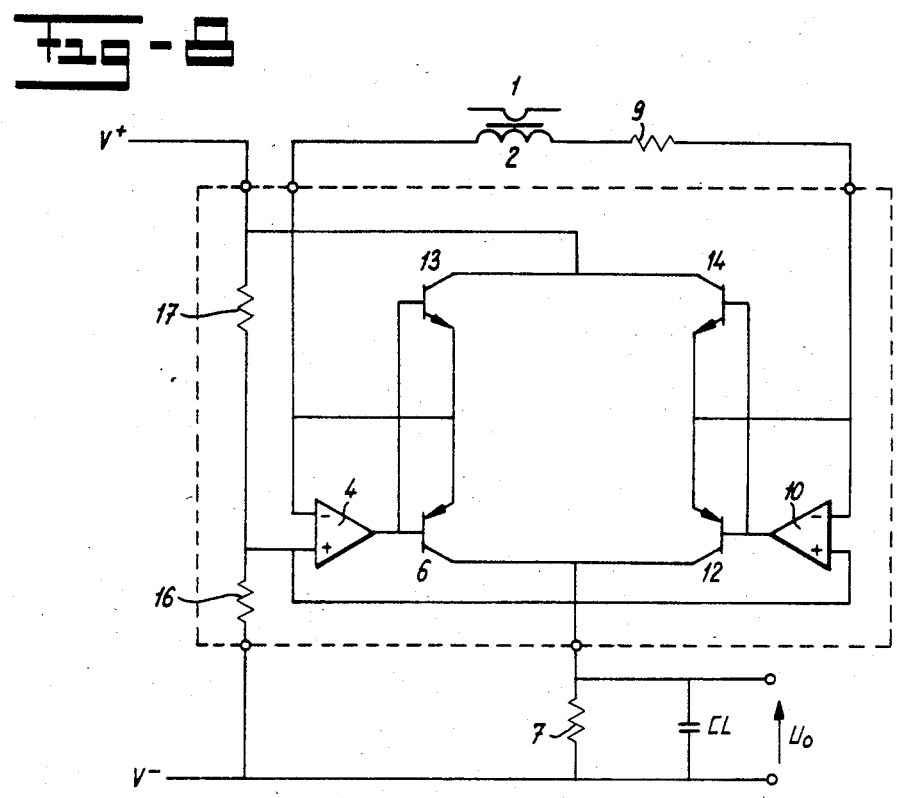
FIG. 8 shows another circuit according to the invention, corresponding to FIG. 5 but with a modified current source.

FIG. 8 shows a circuit corresponding to that shown in FIG. 5, with a modified supply source. The latter consists of a series connection of two resistors 16 and 17, connected to the single voltage source. The connection point of the resistors 16 and 16 is connected to the connection point of the same polarity of the operational amplifiers 4 and 10. The voltage, which in FIG. 5 is provided by the supply source 8, is supplied by way of the resistor 16. The circuit components lying within the box shown in broken lines may be in the form of an integrated circuit.

The active full-wave rectification according to the invention offers the following advantages:
in comparison with half-wave rectification a more rapid reaction to amplitude variations in the primary alternating current is obtained;
ripple in the output voltage is reduced;
the auxiliary voltage $U_r$: the supply source 8 or the zener diode 16 is loaded with two inputs of operational amplifiers and the current input is minimum, so that this auxiliary voltage can easily be obtained by means of a voltage divider from the supply source without a smoothing capacitor being required.

A lower series resistor 9 can be used without the offset voltage having much effect on the output voltage $U_o$.

This will be explained in greater detail with reference to FIGS. 9 to 12.

Figure 9:
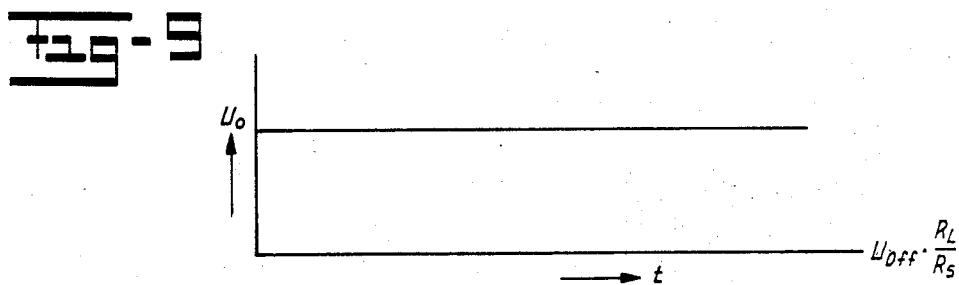
FIGS. 9 to 13 serve to explain the operation and the advantages of the circuit according to the invention.
Figure 10:
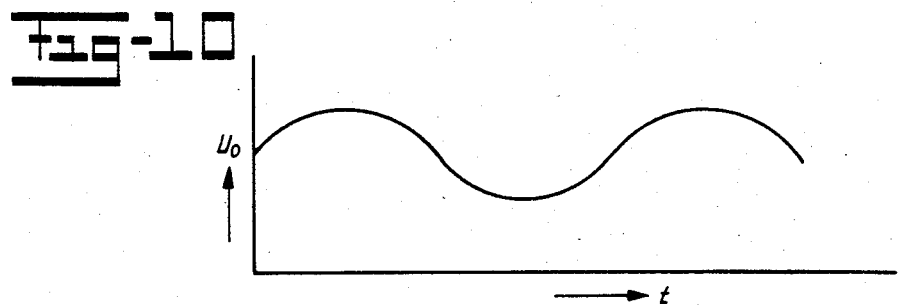

FIGS. 9 and 10 show in succession the output voltage $U_o$ through the resistor 7 for different input currents $I_1$.

In FIG. 9, $I_1 = 0$. Here the offset voltage $U_{off}$ alone gives rise to the output voltage which is now $$\overline{U}_o = U_{off} \frac{R_L}{R_S}.$$

$R_L$ is the resistance value of the resistor 7 and $R_S$ is that of the resistor 9.

For FIG. 10, $1/n\ \hat{I}_1$ is smaller than $$\frac{U_{off}}{R_S}.$$

The mean value of $I^1$ of the sinusoidal current is zero. For the output current $\overline{U}_o$ the following applies:

$$\overline{U}_o = \frac{R_L}{R_S} \cdot U_{off} + \frac{1}{n} \cdot \overline{I}_1 \cdot R_L = \frac{R_L}{R_S} \cdot U_{off} \quad (7)$$

Figure 11:
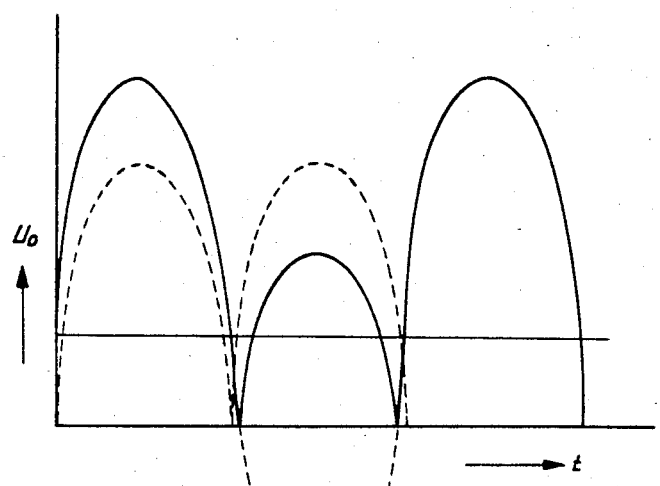

For FIG. 11, $1/n\ \hat{I}_1$ is greater than $$\frac{U_{off}}{R_S}$$

If it is assumed that $$\frac{1}{n} \overline{I}_1 \cdot R_L = a \quad (8)$$

and that $$\frac{U_{off}}{R_S} \cdot R_L = b \quad (9)$$

then $$\overline{U}_o = \frac{2}{\pi}\left\{ a\cos\left(\arcsin\frac{b}{a}\right) + b\arcsin\frac{b}{a} \right\} \quad (10)$$

Equation (10) will be further discussed below. For some values for a and b the following applies:

| | a | b | $\overline{U}_o$ |
|---|---|---|---|
| 1 | 1 | 0 | 0.636 |
| 2 | 1 | 0.2 | 0.649 |
| 3 | 1 | 0.5 | 0.718 |
| 4 | 1 | 1 | 1.0 |

From combination 2 it appears that with an offset of 20% of the amplitude of the input signal, this has an effect on the output signal only for $$\frac{649 - 636}{636} \cdot 100\% = 2\%.$$

In FIG. 11 this can be understood when it is borne in mind that the offset is added to the input signal in one half-cycle and deducted from it in the other half-cycle.

In further explanation of equation (10) it may be observed that U(p) is a rectified voltage consisting of an AC component of the amplitude a and a DC component b: $U(p) = |a \sin p + b|$, as is shown graphically in FIG. 12.

Herein the area S under U(p) for $o < p < 2\pi$ is:

a $S = A + B + D + C + D$

Figure 12:
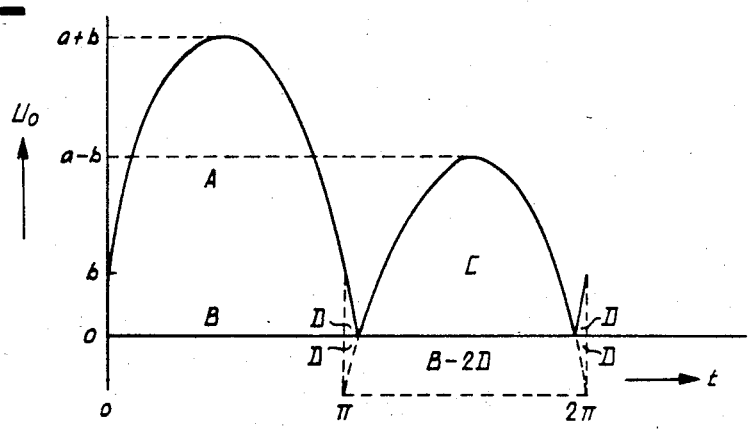

It further appears from FIG. 12 that:

b $C = A = (B - 2D)$.

Substitution of b in a gives:

c $S = 2A + 4D$.

Herein A and D can be calculated from:

d $A = \int_o^\pi a \sin p\ dp = 2a.$

Figure 13:
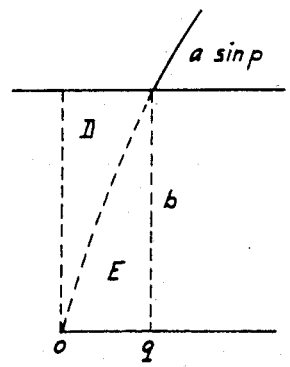

For the calculation of the area D, this part is shown on a larger scale in FIG. 13, that is to say the part under the zero line. From FIG. 13 the following appears:

e $D = b.q - E$ ($q$ in radians).

The dashed line separating D and E is the part of a sin p for $o < p < q$, hence $b = a \sin q = f$ $q = \arc \sin b/a$.
The area E is:

g $E = \int_0^q a \sin p \, dp = a \cos p_q^o = a - a \cos q$ h $E = a - \cos$ arc sin $b/a$.

Substitution of f and h in e gives:

i $D = b$ arc sin $b/a - a + a \cos$ arc sin $b/a$.

i and d can now be substituted in c: the area j $S = 2A + 4D = 4$ ($b$ arc sin $b/a + a \cos$ arc sin $b/a$)

The mean value of U(p) over $2\pi$ radians is:

h $\overline{U}(p) \frac{S}{2\pi} = \frac{S}{2\pi} = \frac{2}{\pi} \left( b \arcsin \frac{b}{a} + a \cos \arcsin \frac{b}{a} \right)$ In an operational circuit according to the invention the following components are used:

| 1 | Operational amplifiers (4, 10) | LM 358 |
|---|---|---|
| 2 | Transistors (6, 12; 13, 14) | BC 556, BC 546 |
| 3 | Current transformer (1, 2) | Ferrite ring core $\mu_e = 10,000$ Number of windings N = 1000 Self-induction L = 5 H |
| 4 | Series resistor $R_S$ (9) | 300 Ω |
| 5 | Diodes (5, 11) | BAX 16 |

It is obvious that the invention is not restricted to the circuits illustrated and discussed above, but that modifications and additions are within the scope of the invention.

I claim:

1. An active full-wave rectifier detector circuit, comprising:
   first and second operational amplifiers each having an inverting input-connected to respective terminals of a secondary winding of a current transformer, with the inverting input of said second operational amplifier including a resistance, the non-inverting input of each of said operational amplifiers being connected to a reference voltage;
   first and second trasistors of the same conductivity type each having a base electrode connected to a respective output of said first and second operational amplifiers, one of the remaining electrodes of each said first and second transistor connected to the inverting input of a respective one of said first and second operational amplifiers, and the remaining electrode of each of said first and second transistors being commonly connected;
   a rectifying element being connected between the inverting input and output of each said first and second operational amplifiers;
   a resistance connected in the common connection of said first and second transistors to provide an output signal; and
   said reference voltage being greater than the maximum output signal.

2. The active full-wave rectifier detector circuit as claimed in claim 1 wherein said rectifying elements are diodes.

3. The active full-wave rectifier detector circuit as claimed in claim 1 wherein said rectifying elements are additional transistors of the same but opposite conduction type as said first and second transistors, the respective bases of said additional transistors being connected to a respective output of said first and second operational amplifiers and one of the remaining common electrode elements of said additional transistors being connected to the same respective electrode of said first and second transistors, the other commonly connected electrode of said additional transistors being connected to a voltage source.

4. The active full-wave rectifier detector circuit as claimed in claim 3, wherein said reference voltage and said voltage source are formed by a voltage network comprising voltage sources of opposite polarity interconnected by a pair of series-connected resistances.

* * * * *